(12) United States Patent
Hu

(10) Patent No.: US 11,075,635 B2
(45) Date of Patent: Jul. 27, 2021

(54) DISPLAY DEVICE AND MANUFACTURING METHOD OF SAME

(71) Applicant: WUHAN CHINA STAR OPTOELECTRONICS SEMICONDUCTOR DISPLAY TECHNOLOGY CO., LTD., Wuhan (CN)

(72) Inventor: Jian Hu, Wuhan (CN)

( * ) Notice: Subject to any disclaimer, the term of this patent is extended or adjusted under 35 U.S.C. 154(b) by 0 days.

(21) Appl. No.: 16/649,683

(22) PCT Filed: Nov. 22, 2019

(86) PCT No.: PCT/CN2019/120180
§ 371 (c)(1),
(2) Date: Mar. 23, 2020

(87) PCT Pub. No.: WO2021/036032
PCT Pub. Date: Mar. 4, 2021

(65) Prior Publication Data
US 2021/0096683 A1     Apr. 1, 2021

(30) Foreign Application Priority Data
Aug. 28, 2019   (CN) .......................... 201910799153.X

(51) Int. Cl.
*H05K 1/16*     (2006.01)
*H05K 1/18*     (2006.01)
(Continued)

(52) U.S. Cl.
CPC ........... *H03K 17/964* (2013.01); *H03K 17/96* (2013.01); *H05K 3/0023* (2013.01); *H05K 3/1216* (2013.01)

(58) Field of Classification Search
CPC ............ H05K 1/16; H05K 1/18; H05K 1/162; H05K 1/167; H05K 1/183; H05K 1/095;
(Continued)

(56) References Cited

U.S. PATENT DOCUMENTS 5,912,507 A * 6/1999 Dunn ................ H01L 23/49811
257/767
5,920,454 A * 7/1999 Nomura ................ H05K 1/183
361/313
(Continued)

FOREIGN PATENT DOCUMENTS

| CN | 103902117 A | 7/2014 |
|---|---|---|
| CN | 106909258 A | 6/2017 |

(Continued)

*Primary Examiner* — Xiaoliang Chen

(57) ABSTRACT

A display device and a manufacturing method of the same are provided. The display device includes a frame, a pressure sensor, and a pressure sensing module. When a touch portion receives external pressure, a resistance value of the resistor changes, and a corresponding pressure sensing signal is output. The pressure sensing module outputs an execution signal according to the pressure sensing signal to realize a pressure touch function on a side of the frame. This eliminates a need to make holes in a side of the frame, which eliminates a mechanical button and improves dustproof and waterproof performance of the display device.

4 Claims, 3 Drawing Sheets

(51) Int. Cl.
*H03K 17/96* (2006.01)
*H01C 17/00* (2006.01)
*H01C 17/06* (2006.01)
*H01C 17/065* (2006.01)
*H01L 23/48* (2006.01)
*H01L 23/498* (2006.01)
*H05K 3/12* (2006.01)
*H05K 3/00* (2006.01)

(58) Field of Classification Search
CPC .. H05K 3/0023; H05K 3/1216; H05K 3/4644; H03K 17/96; H03K 17/964; H01C 17/00; H01C 17/06; H01C 17/065; H01C 17/003
USPC ......... 257/E27.001, 767; 361/313, 765, 766; 438/382; 427/101; 338/162, 172, 196
See application file for complete search history.

(56) References Cited

U.S. PATENT DOCUMENTS

| | | | |
|---|---|---|---|
| 5,939,973 A * | 8/1999 | Imamura | H01C 10/36 338/172 |
| 6,171,921 B1 * | 1/2001 | Dunn | H01C 17/003 427/101 |
| 2013/0044059 A1 | 2/2013 | Fu | |
| 2013/0154998 A1 * | 6/2013 | Yang | G06F 3/0418 345/174 |
| 2013/0253293 A1 * | 9/2013 | Ocvirk | G01N 27/3271 600/345 |

FOREIGN PATENT DOCUMENTS

| | | |
|---|---|---|
| CN | 107145261 A | 9/2017 |
| CN | 109669540 A | 4/2019 |

* cited by examiner

DISPLAY DEVICE AND MANUFACTURING METHOD OF SAME

This application claims the priority of Chinese Application No. 201910799153.X filed on Aug. 28, 2019 and titled "DISPLAY DEVICE AND MANUFACTURING METHOD OF SAME, which is incorporated herein by reference in its entirety.

FIELD OF INVENTION

The present disclosure relates to the field of display technologies, and more particularly to a display device and a manufacturing method of the same.

BACKGROUND OF INVENTION

With the development of mobile phone technology, people's dependence on mobile phones is becoming stronger and stronger, and the environment in which mobile phones are used is constantly changing. As a result, a demand for mobile phones to be dust-proof and waterproof is increasing.

Technical Problem

Because mobile phone shells are currently mostly made of metal, capacitive touch cannot be applied to metal surfaces. If the traditional pressure touch technology is used, the metal needs to be deformed. Metal cannot be both hard and soft, so the industry is currently using mechanical buttons. When mechanical buttons are used for buttons on a side of a metal cover, process is simple and production cost is low. However, due to a need to make holes in a side of a cover, an overall dustproof and waterproof performance of the mobile phone is greatly reduced, and an overall appearance of the mobile phone is greatly affected.

In summary, the mechanical buttons on the side of the existing display device cause issues of poor dustproof and waterproof performance of the existing display device. Therefore, it is necessary to provide a display device and a manufacturing method of the same to improve this defect.

SUMMARY OF INVENTION

An embodiment of the present application provides provide a display device and a manufacturing method of the same to improve issues that mechanical buttons on a side of an existing display device cause issues of poor dustproof and waterproof performance of the existing display device.

An embodiment of the present application provides a display device, comprising: a frame having a touch portion on the frame; a pressure sensor fixed on a side of the frame and the touch portion corresponding to each other, wherein the pressure sensor comprises a flexible circuit board, a resistance connection circuit, and a plurality of resistors, the resistance connection circuit is formed on the flexible circuit board, and the plurality of resistors are bridged through the resistance connection circuit; and a pressure sensing module connected to the pressure sensor and configured to receive a pressure sensing signal output by the pressure sensor and output an execution signal corresponding to the pressure sensing signal.

In an embodiment of the present application, the pressure sensing module comprises a signal amplification circuit, a digital signal converter, and a pressure sensing chip, the signal amplification circuit is connected to the resistance connection circuit, and is configured to receive the pressure sensing signal and perform signal amplification processing, then transmit the pressure sensing signal to the digital signal converter for conversion into a digital signal, and finally, the pressure sensing chip outputs the execution signal according to the digital signal.

In an embodiment of the present application, the resistance connection circuit comprises a first input terminal and a second input terminal, the resistors comprise a first resistor, a second resistor, a third resistor, and a fourth resistor, an end of the first resistor is connected to an end of the second resistor and connected to a power supply voltage circuit, another end of the first resistor is connected to an end of the third resistor and both are connected to the first input terminal of the resistance connection circuit, another end of the second resistor is connected to an end of the fourth resistor and both are connected to the second input terminal of the resistance connection circuit, and another end of the third resistor is connected to another end of the fourth resistor and connected to a common ground terminal voltage circuit.

In an embodiment of the present application, material of the resistors comprises fullerene.

In an embodiment of the present application, resistance values of the resistors in the same resistance connection circuit are same.

In an embodiment of the present application, the pressure sensing module and the frame are bonded by a pressure-sensitive adhesive.

An embodiment of the present application further provides a display device, comprising: a frame having a touch portion on the frame; a pressure sensor fixed on a side of the frame and the touch portion corresponding to each other, wherein the pressure sensor comprises a flexible circuit board, a resistance connection circuit, and a plurality of resistors, the resistance connection circuit is formed on the flexible circuit board, and the plurality of resistors are bridged through the resistance connection circuit; and a pressure sensing module connected to the pressure sensor and configured to receive a pressure sensing signal output by the pressure sensor and output an execution signal corresponding to the pressure sensing signal; wherein the pressure sensing module comprises a signal amplification circuit, the signal amplification circuit is connected to the resistance connection circuit and is configured to receive the pressure sensing signal and perform signal amplification processing.

In an embodiment of the present application, the pressure sensing module further comprises a digital signal converter and a pressure sensing chip, the digital signal converter is configured to convert the pressure sensing signal that has been amplified into a digital signal, and the pressure sensing chip is configured to output the execution signal according to the digital signal.

In an embodiment of the present application, the resistance connection circuit comprises a first input terminal and a second input terminal, the resistors comprise a first resistor, a second resistor, a third resistor, and a fourth resistor, an end of the first resistor is connected to an end of the second resistor and connected to a power supply voltage circuit, another end of the first resistor is connected to an end of the third resistor and both are connected to the first input terminal of the resistance connection circuit, another end of the second resistor is connected to an end of the fourth resistor and both are connected to the second input terminal of the resistance connection circuit, and another end of the third resistor is connected to another end of the fourth resistor and connected to a common ground terminal voltage circuit.

In an embodiment of the present application, material of the resistors comprises fullerene.

In an embodiment of the present application, resistance values of the resistors in the same resistance connection circuit are same.

In an embodiment of the present application, the pressure sensing module and the frame are bonded by a pressure-sensitive adhesive.

An embodiment of the present application further provides a manufacturing method of a display device, comprising: providing a flexible circuit board on which a resistance connection circuit comprising a plurality of opening portions is formed by etching; printing a carbon-blocking ink on a surface of the flexible circuit board to cover the opening portions, and curing the carbon-blocking ink to form a resistor by heating and baking; printing a silver paste on both sides of the resistor to connect the resistor to the resistance connection circuit to form a path; and binding a pressure sensing module to the flexible circuit board and fixing the flexible circuit board to an inner side of a frame of the display device through a pressure sensitive adhesive.

In an embodiment of the present application, the manufacturing method further comprises after printing the silver paste is completed, printing an insulating layer on the surface of the flexible circuit board to prevent the silver paste from oxidizing and protect the resistance connection circuit.

In an embodiment of the present application, the method of etching to form the resistance connection circuit is a yellow light etching process.

In an embodiment of the present application, the method of printing the carbon-blocking ink is: dumping the carbon-blocking ink to a starting position of a doctor blade on a screen, maintaining a space between the flexible circuit board and the screen, the doctor blade uniformly printing the carbon-blocking ink to the surface of the flexible circuit board according to a fixed pressure and speed.

Beneficial Effect

Beneficial effect of the present disclosure: the embodiment of the present disclosure fixes the pressure sensor on a side of the frame corresponding to the touch portion. A flexible circuit board, a resistance connection circuit, and a plurality of resistors are arranged inside the pressure sensor. The resistors are bridged by the resistance connection circuit. The pressure sensing module is connected to the pressure sensor. When the touch portion receives external pressure, a resistance value of the resistor changes, and a corresponding pressure sensing signal is output. The pressure sensing module outputs a corresponding execution signal according to the pressure sensing signal, so as to realize a pressure touch function of buttons on a side of the frame. That is, there is no need to make holes in a side of the frame. This eliminates a traditional mechanical button and improves dustproof and waterproof performance of the display device.

DESCRIPTION OF DRAWINGS

In order to explain technical solutions in embodiments or the prior art more clearly, the accompanying drawings used in the description of the embodiments or the prior art will be briefly introduced below. Obviously, the drawings in the following description are only some embodiments of the present invention. For those of ordinary skill in the art, other drawings can be obtained according to these drawings without paying creative efforts.

DETAILED DESCRIPTION OF PREFERRED EMBODIMENTS

Figure 1:
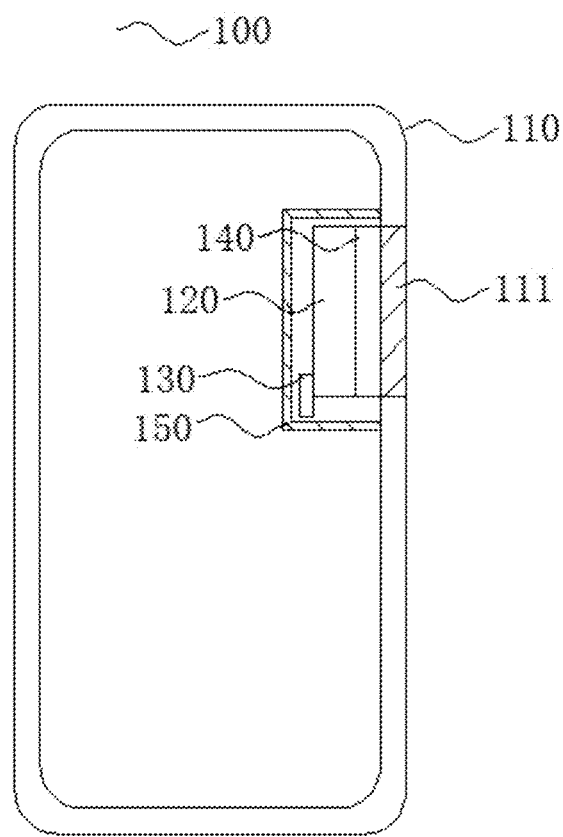
FIG. 1 is a schematic structural diagram of a display device according to a first embodiment of the present disclosure.

The following descriptions of embodiments are with reference to the attached drawings to illustrate specific embodiments that can be implemented by the present application. The directional terms mentioned in this application, such as up, down, front, rear, left, right, inside, outside, side, etc., are only directions referring to the attached drawings. Therefore, the directional terms used are used to explain and understand the present application, not to limit the present application. In the figures, similarly structured units are denoted by the same reference numerals.

The present disclosure is further described below with reference to the drawings and specific embodiments.

First Embodiment

The embodiment of the present disclosure provides a display device 100, which is described in detail below with reference to FIG. 1 and FIG. 2.

As shown in FIG. 1, FIG. 1 is a schematic structural diagram of a display device 100 according to an embodiment of the present disclosure. The display device 100 includes a frame 110, a pressure sensor 120, and a pressure sensing module 130. A touch portion 111 is disposed on the frame 110. The pressure sensor 120 is fixed on a side of the frame 110 and the touch portion 111 corresponding to each other. When the touch portion 111 receives external pressure, the pressure sensor 120 will generate a corresponding pressure sensing signal. The pressure sensing module 130 is connected to the pressure sensing module 120. The pressure sensing module 130 is configured to receive the pressure sensing signal, determine a touch position, a size of a touch pressure, and a length of a touch time according to the pressure sensing signal, and output an execution signal corresponding thereto.

Figure 2:
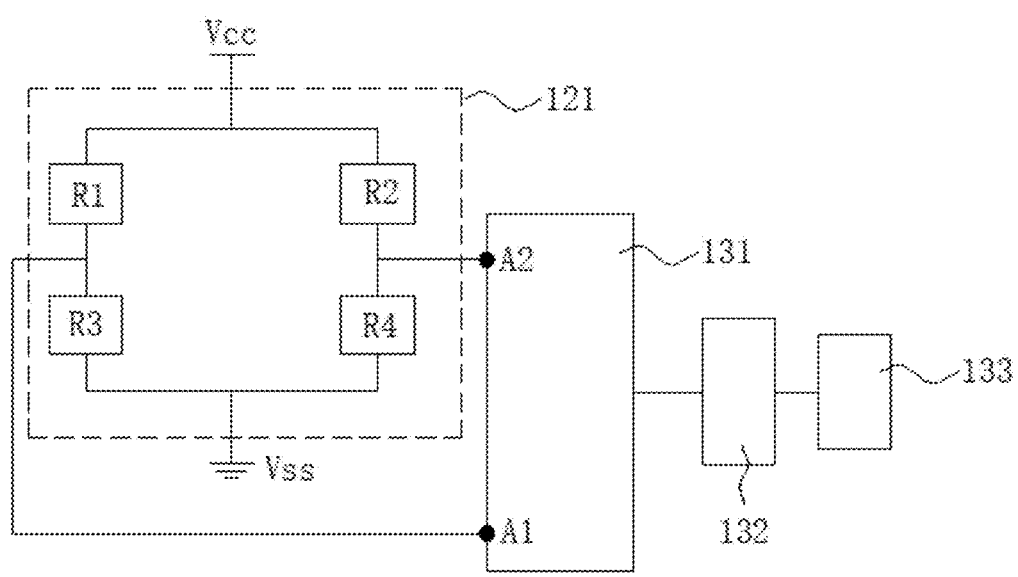
FIG. 2 is a schematic diagram of a circuit structure of a pressure sensor according to a first embodiment of the present disclosure.

As shown in FIG. 2, FIG. 2 is a schematic diagram of a circuit structure of a pressure sensor 120 according to an embodiment of the present disclosure. The pressure sensor 120 includes a flexible circuit board (not shown), a resistance connection circuit 121, and a plurality of resistors. The resistance connection circuit 121 is formed on the flexible circuit board. The plurality of resistors are bridged through the resistance connection circuit 121.

In this embodiment, the resistance connection circuit 121 includes a first input terminal A1 and a second input terminal A2. The resistors include a first resistor R1, a second resistor R2, a third resistor R3, and a fourth resistor R4. One end of the first resistor R1 is connected to one end of the second resistor R2 and connected to a power voltage circuit Vcc. The other end of the first resistor R1 and one end of the third resistor R3 are connected and both are connected to the first input terminal A1 of the resistance connection circuit. The other end of the second resistor R2 is connected to one end of the fourth resistor R4 and both are connected to the second input terminal A2 of the resistance connection circuit. The other end of the third resistor R3 is connected to the other end of the fourth resistor R4 and connected to a common ground terminal voltage circuit Vss.

In this embodiment, the resistance values of the resistors located in the same resistance connection circuit 121 are same.

In this embodiment, material of the resistor includes fullerene (C60). An atomic structure of fullerene is spherical, and a molecular structure is a laminated structure. When the touch portion 111 is subjected to external pressure, the atoms in fullerene will be deformed to cause a volume of a single layer to change. This results in a change in the resistance value of the resistor. In addition, the external pressure causes inner layers of the molecule to connect with each other and the molecular structure changes. This will also cause the resistance value of the resistor to change, thereby realizing external pressure to change the resistance value of the resistor.

As shown in FIG. 2, the pressure sensing module 130 includes a signal amplification circuit 131, a digital signal converter 132, and a pressure sensing chip 133. The signal amplification circuit 131 is connected to the resistance connection circuit 121. The signal amplification circuit 131 is configured to receive the pressure sensing signal and perform signal amplification processing, and then transmit the pressure sensing signal to the digital signal converter 132 to convert the pressure sensing signal into a digital signal. Finally, the pressure sensing chip 133 outputs the execution signal according to the digital signal.

Specifically, when the touch portion 111 receives external pressure, the first resistor R1, the second resistor R2, the third resistor R3, and the fourth resistor R4 are all deformed by force, and the resistance values thereof change. Since a first pressure sensing signal between the second resistor R2 and the fourth resistor R4 and a second pressure sensing signal between the first resistor R1 and the third resistor R3 are stable under static conditions. When the pressure sensor 120 is subjected to external pressure, the resistance of each resistor will change. The first pressure sensing signal between the second resistor R2 and the fourth resistor R4 will change before and after the pressure sensor 120 is stressed. The second pressure sensing signal between the first resistor R1 and the third resistor R3 will also change before and after the pressure sensor 120 is stressed. Therefore, an original bridge circuit is out of balance. The first pressure sensing signal and the second pressure sensing signal generate a voltage difference. This voltage difference may be very weak, but after the signal amplification circuit 131 performs signal amplification processing, it can be processed by the digital signal converter 132 and the pressure sensing chip 133.

As shown in FIG. 1, the pressure sensor 120 and the frame 110 are adhered by a pressure sensitive adhesive 140.

In this embodiment, different functions can be implemented by pressing the touch portion 111 in different ways. For example, pressing positions of endpoints on both sides of the touch portion 111 can adjust a volume of the display device 100. By pressing the touch portion 111 continuously for 5 seconds to 10 seconds, a voice control of the display device can be woken up. Power can be turned off by pressing the touch portion for 10 seconds or more. Of course, time and function of continuous pressing can be changed and set differently according to actual needs, which will not be repeated here. In some embodiments, both ends of the frame 110 of the display device 100 may be provided with the touch portion 111, the pressure sensor 120, and the pressure sensing module 130, to implement more abundant functions. For example, by simultaneously pressing the touch portion on both sides, screen of the display device 100 can be turned off.

Preferably, as shown in FIG. 1, in order to prevent other components inside the display device from colliding with the pressure sensor 120 and causing a false touch. Retaining walls 150 are provided on the pressure sensor 120 and the pressure sensing module 130 on the other three sides except for the touch portion 111. The retaining wall 150 may be made of stainless steel or may be replaced by other materials with strong hardness and not easily deformed.

In the embodiment of the present disclosure, when the resistance in the pressure sensor 120 is touched multiple times for a long time, sensing sensitivity of the resistance will decrease. Software of the display device 100 can be updated periodically to ensure stability of the use of the display device 100.

In the embodiment of the present disclosure, the pressure sensor 120 is fixed on a side of the frame 110 corresponding to the touch portion 111. A flexible circuit board, a resistance connection circuit 121, and a plurality of resistors are provided inside the pressure sensor 120. The resistors are bridged by the resistor connection circuit 121. The pressure sensing module 130 is connected to the pressure sensor 120. When the touch portion 111 receives external pressure, the resistance value of the resistor changes, and a corresponding pressure sensing signal is output. The pressure sensing module 130 outputs a corresponding execution signal according to the pressure sensing signal. This realizes the pressure touch function of a side button of the frame 110. That is, there is no need to make holes in a side of the frame 110. This eliminates traditional mechanical buttons, making functions of a side button richer and more diverse. This can also improve dustproof and waterproof performance of the display device 100 and simplify a structure of the display device 100.

Second Embodiment

The embodiment of the present disclosure provides a method of manufacturing a display device, which will be described in detail below with reference to FIG. 3 and FIG. 4A to FIG. 4D.

Figure 3:
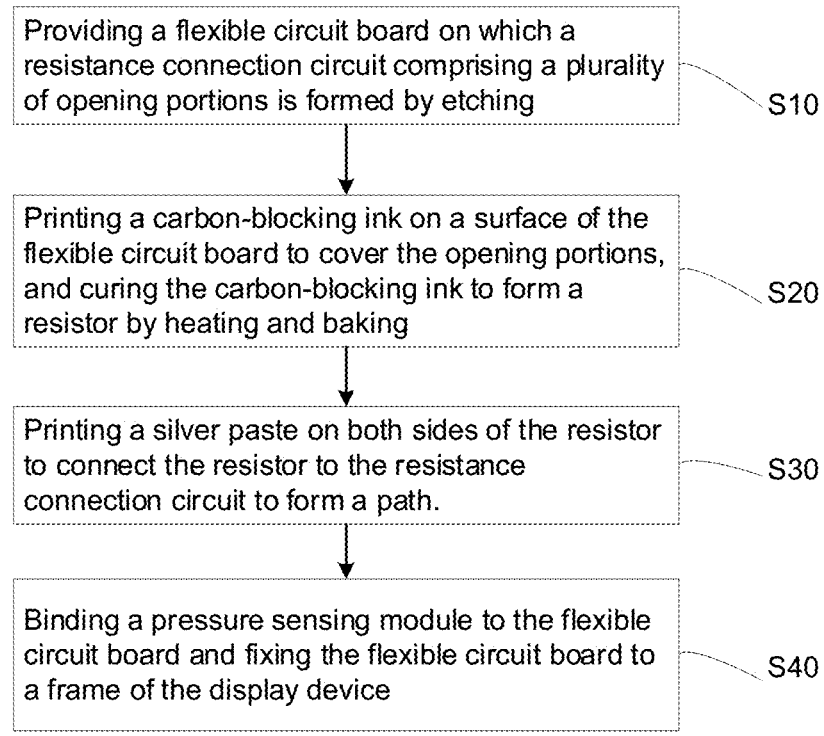
FIG. 3 is a schematic flowchart of a method of manufacturing a display device according to a second embodiment of the disclosure.
Figure 4A:
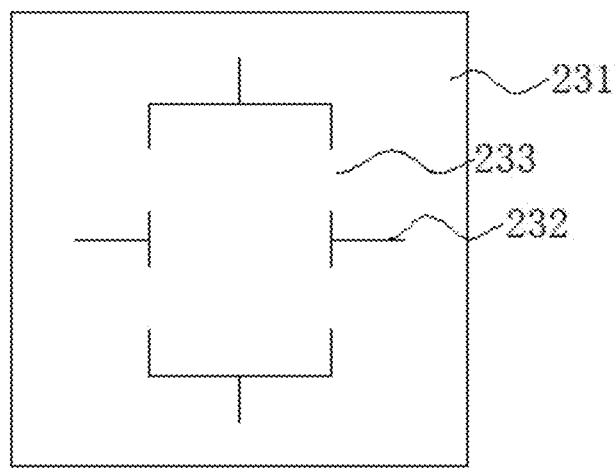
FIG. 4A is a schematic structural diagram of a touch sensor according to a second embodiment of the present disclosure.
Figure 4B:
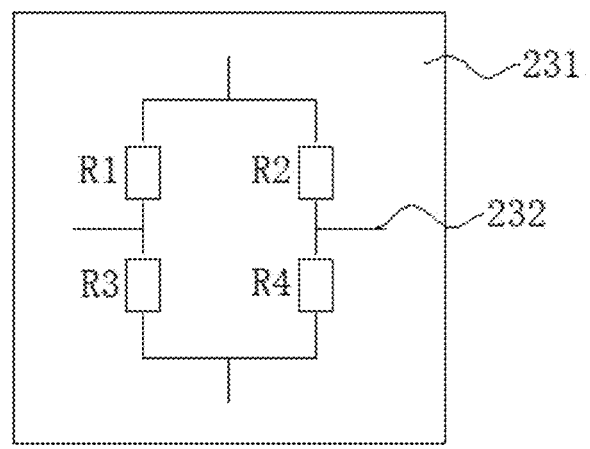
FIG. 4B is a schematic structural diagram of a touch sensor according to a second embodiment of the present disclosure.
Figure 4C:
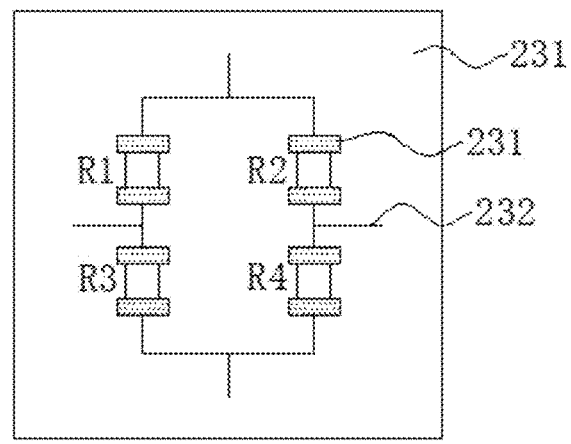
FIG. 4C is a schematic structural diagram of a touch sensor according to a second embodiment of the present disclosure.
Figure 4D:
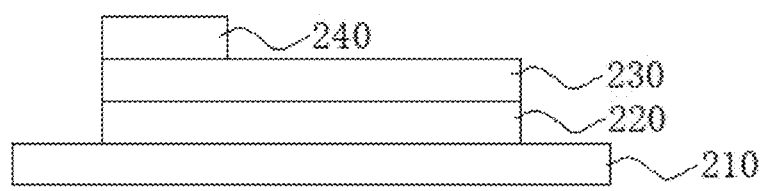
FIG. 4D is a schematic structural diagram of a display device according to a second embodiment of the present disclosure.

As shown in FIG. 3, FIG. 3 is a schematic flowchart of a method of manufacturing a display device according to an embodiment of the disclosure. FIG. 4A, FIG. 4B, and FIG. 4C are schematic diagrams of a touch sensor structure, and FIG. 4D is a schematic diagram of a display device structure. The manufacturing method includes:

Step S10, providing a flexible circuit board 231 on which a resistance connection circuit 232 comprising a plurality of opening portions 233 is formed by etching.

Step S20, printing a carbon-blocking ink on a surface of the flexible circuit board 231 to cover the opening portions 233, and curing the carbon-blocking ink to form a resistor by heating and baking.

Step S30, printing a silver paste 231 on both sides of the resistor to connect the resistor to the resistance connection circuit 232 to form a path.

Step S40, binding a pressure sensing module 240 to the flexible circuit board 231 and fixing the flexible circuit board 231 to a frame 210 of the display device 200.

Referring to FIG. 4C, the resistors are bridged through the resistance connection circuit 232. The resistors include a first resistor R1, a second resistor R2, a third resistor R3, and a fourth resistor R4. One end of the first resistor R1 is connected to one end of the second resistor R2. The other end of the first resistor R1 and one end of the third resistor R3 are connected. The other end of the second resistor R2 is connected to one end of the fourth resistor R4. The other end of the third resistor R3 is connected to the other end of the fourth resistor R4.

In the step S20, the flexible circuit board 231 is baked by heating, so that the role is not only to solidify the carbon-blocking ink to form a resistor, but also to remove internal stress generated during the printing process. This makes the carbon resistance more evenly distributed on the flexible circuit board 231.

In the step S30, excellent conductivity of the silver paste 231 is used to connect the resistor to the resistor connection circuit 232 to form a path. The resistor, the resistance connection circuit 232, and the flexible circuit board 231 constitute the pressure sensor 230. In some embodiments, a length of the resistor can be changed by adjusting a distance between the silver paste 231 on both sides of the resistor, thereby controlling a resistance value of the resistor.

In this embodiment, material of the resistor includes fullerene (C60). An atomic structure of fullerene is spherical, and a molecular structure is a laminated structure. When the pressure sensor 230 is subjected to external pressure, the atoms in fullerene will be deformed to cause a volume of a single layer to change. This results in a change in the resistance value of the resistor. In addition, the external pressure causes inner layers of the molecule to connect with each other and the molecular structure changes. This will also cause the resistance value of the resistor to change, thereby realizing external pressure to change the resistance value of the resistor.

In an embodiment of the present application, the manufacturing method further comprises after printing the silver paste is completed, printing an insulating layer on the surface of the flexible circuit board. Because the carbon resistance material has the function of absorbing water, long-term exposure to air will cause the resistance value to change, and even cause touch failure. In addition, when the silver paste 231 is exposed to the air, it will become black due to long-term oxidation, and conductivity will be reduced, making touch insensitive and even ineffective. Therefore, printing an insulating layer on the surface of the flexible circuit board 231 can prevent the silver paste from oxidizing, and at the same time protect the resistance connection circuit 232 and the flexible circuit board 231.

In an embodiment of the present application, in the step S10, the method of etching to form the resistance connection circuit 232 is a yellow light etching process.

In an embodiment of the present application, the method of printing the carbon-blocking ink is: dumping the carbon-blocking ink to a starting position of a doctor blade on a screen, maintaining a space between the flexible circuit board 231 and the screen, the doctor blade uniformly printing the carbon-blocking ink to the surface of the flexible circuit board 231 according to a fixed pressure and speed.

In the step S40, the flexible circuit board 231 is fixed to the frame 210 of the display device 200, and it can be pressed by a roller to meet a requirement of bonding pressure.

In the embodiment of the present disclosure, the pressure sensor 230 is fixed on the frame 210. A flexible circuit board 231, a resistance connection circuit 232, and a plurality of resistors are provided inside the pressure sensor 120. The resistors are bridged by the resistor connection circuit 232. The pressure sensing module 240 is connected to the pressure sensor 230. When the frame 210 receives external pressure, the resistance value of the resistor changes, and a corresponding pressure sensing signal is output. The pressure sensing module 240 outputs a corresponding execution signal according to the pressure sensing signal. This realizes the pressure touch function of a side button of the frame 210. That is, there is no need to make holes in a side of the frame 210. This eliminates traditional mechanical buttons, making functions of a side button richer and more diverse. This can also improve dustproof and waterproof performance of the display device 200 and simplify a structure of the display device 200.

In summary, although the present disclosure is disclosed as above with preferred embodiments, the above preferred embodiments are not intended to limit the present disclosure. Those of ordinary skill in the art can make various modifications and decorations without departing from the spirit and scope of the present disclosure. Therefore, the protection scope of the present disclosure is based on the scope defined by the claims.

What is claimed is:

1. A manufacturing method of a display device, comprising:
    providing a flexible circuit board on which a resistance connection circuit comprising a plurality of opening portions is formed by etching;
    printing a carbon-blocking ink on a surface of the flexible circuit board to cover the opening portions, and curing the carbon-blocking ink to form a resistor by heating and baking;
    printing a silver paste on both sides of the resistor to connect the resistor to the resistance connection circuit to form a path; and
    binding a pressure sensing module to the flexible circuit board and fixing the flexible circuit board to an inner side of a frame of the display device through a pressure sensitive adhesive.

2. The manufacturing method according to claim 1, further comprising after printing the silver paste is completed, printing an insulating layer on the surface of the flexible circuit board to prevent the silver paste from oxidizing and protect the resistance connection circuit.

3. The manufacturing method according to claim 1, wherein the method of etching to form the resistance connection circuit is a yellow light etching process.

4. The manufacturing method according to claim 1, wherein the method of printing the carbon-blocking ink is: dumping the carbon-blocking ink to a starting position of a doctor blade on a screen, maintaining a space between the flexible circuit board and the screen, the doctor blade uniformly printing the carbon-blocking ink to the surface of the flexible circuit board according to a fixed pressure and speed.

* * * * *